United States Patent
Lin et al.

(10) Patent No.: US 10,986,445 B1
(45) Date of Patent: Apr. 20, 2021

(54) METHOD FOR CALCULATING EXCURSION OF DIAPHRAGM OF SPEAKER, SPEAKER PROTECTION DEVICE AND COMPUTER READABLE STORAGE MEDIUM

(71) Applicant: Realtek Semiconductor Corporation, Hsinchu (TW)

(72) Inventors: Tse-En Lin, Hsinchu (TW); Chung-Shih Chu, Hsinchu (TW); Wei-Chung Ting, Hsinchu (TW); Tien-Chiu Hung, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/934,366

(22) Filed: Jul. 21, 2020

(30) Foreign Application Priority Data

Mar. 6, 2020 (TW) ................................ 109107530

(51) Int. Cl.
*H04R 3/00* (2006.01)
*G01R 27/16* (2006.01)

(52) U.S. Cl.
CPC ............ *H04R 3/007* (2013.01); *G01R 27/16* (2013.01)

(58) Field of Classification Search
CPC ... H04R 3/00; H04R 3/04; H04R 3/12; H04R 3/007; H04R 3/002; H04R 3/08; H04R 29/003; H04R 29/001; H04R 29/00; G01R 27/16; H03F 1/52; H03F 2200/331; H03G 11/00; H04S 7/301

USPC ................................................ 381/55, 59, 96
See application file for complete search history.

(56) References Cited

U.S. PATENT DOCUMENTS

| | | |
|---|---|---|
| 7,372,966 B2 | 5/2008 | Bright |
| 8,712,065 B2 | 4/2014 | Solgaard et al. |
| 9,066,171 B2 | 6/2015 | Rauhala et al. |
| 9,363,599 B2 | 6/2016 | Su et al. |
| 9,837,971 B2 | 12/2017 | Luo et al. |
| 2004/0086140 A1* | 5/2004 | Fedigan ............ H04R 3/00 381/96 |
| 2010/0232617 A1* | 9/2010 | Hartung ............ H04S 1/002 381/71.7 |
| 2013/0251164 A1* | 9/2013 | Gautama ............ H04R 3/002 381/59 |
| 2016/0157015 A1* | 6/2016 | Van Schyndel ...... H04R 3/007 381/55 |
| 2017/0272857 A1* | 9/2017 | Ting .................. H04R 3/007 |
| 2018/0160228 A1* | 6/2018 | Hu .................... H04R 3/007 |
| 2020/0177990 A1* | 6/2020 | Turner ............... H03F 1/3264 |

\* cited by examiner

*Primary Examiner* — Ahmad F. Matar
*Assistant Examiner* — Sabrina Diaz
(74) *Attorney, Agent, or Firm* — Locke Lord LLP; Tim Tingkang Xia, Esq.

(57) ABSTRACT

A method for calculating excursion of a diaphragm of a speaker, which includes: calculating a DC resistance based on a feedback signal of the speaker; calculating an impedance based on the feedback signal and the DC resistance; calculating a transfer function between a signal and a velocity of the diaphragm of the speaker based on the DC resistance, the impedance, and a force factor; and calculating the excursion of the diaphragm of the speaker based on an input signal and the transfer function.

20 Claims, 2 Drawing Sheets

METHOD FOR CALCULATING EXCURSION OF DIAPHRAGM OF SPEAKER, SPEAKER PROTECTION DEVICE AND COMPUTER READABLE STORAGE MEDIUM

RELATED APPLICATIONS

This application claims priority to Taiwan Application Serial Number 109107530, filed Mar. 6, 2020, which is herein incorporated by reference.

BACKGROUND

Field of Invention

The present disclosure relates to an electronic device and a calculation method. More particularly, the present disclosure relates to a speaker protection device, a method for calculating excursion of a diaphragm of a speaker, and a computer readable storage medium.

Description of Related Art

With the advancement of science and technology and in response to customer demand, electronic products have gradually become light, slim, short and small, and speakers in electronic products also have to be reduced in size and weight. However, when a louder sound is played, miniaturized speakers tend to approach their physical limits, thus causing the speakers to be damaged.

For the foregoing reasons, there is a need to resolve the above-mentioned problem by providing a speaker protection device, a method for calculating excursion of a diaphragm of a speaker, and a computer readable storage medium.

SUMMARY

The foregoing presents a simplified summary of the disclosure in order to provide a basic understanding to the reader. This summary is not an extensive overview of the disclosure and it does not identify key/critical elements of the present disclosure or delineate the scope of the present disclosure. Its sole purpose is to present some concepts disclosed herein in a simplified form as a prelude to the more detailed description that is presented later.

A method for calculating excursion of a diaphragm of a speaker is provided. The method comprises: calculating a direct-current (DC) resistance based on a feedback signal of the speaker; calculating an impedance based on the feedback signal and the DC resistance; calculating a transfer function between a signal and a velocity of the diaphragm of the speaker based on the DC resistance, the impedance, and a force factor; and calculating the excursion of the diaphragm of the speaker based on an input signal and the transfer function.

The present disclosure provides a speaker protection device. The speaker protection device comprises a detector and a processor. The detector is configured to detect a feedback signal of a speaker. The processor is configured to: calculate a DC resistance based on the feedback signal; calculate an impedance based on the feedback signal and the DC resistance; calculate a transfer function between a signal and a velocity of a diaphragm of the speaker based on the DC resistance, the impedance, and a force factor; and calculate excursion of the diaphragm of the speaker based on an input signal and the transfer function.

The present disclosure further provides a non-transitory computer readable storage medium storing a computer program for performing a method for calculating excursion of a diaphragm of a speaker. The method includes: calculating a DC resistance based on a feedback signal of the speaker; calculating an impedance based on the feedback signal and the DC resistance; calculating a transfer function between a signal and a velocity of the diaphragm of the speaker based on the DC resistance, the impedance, and a force factor; and calculating the excursion of the diaphragm of the speaker based on an input signal and the transfer function.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
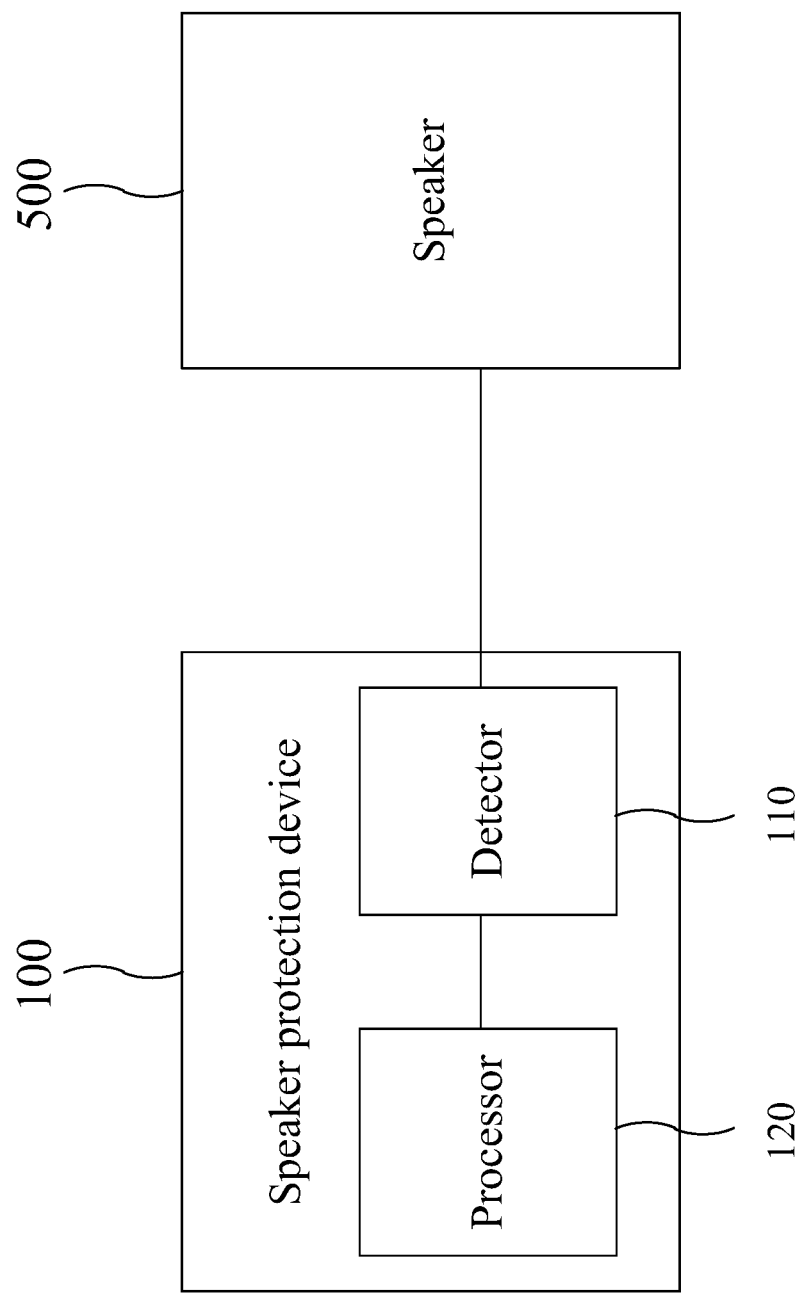
FIG. 1 depicts a schematic diagram of circuit blocks of a speaker and its protection device according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts. However, the embodiments provided herein are intended as illustrative only since numerous modifications and variations therein will be apparent to those skilled in the art. Description of the operation does not intend to limit the operation sequence. Any structures resulting from recombination of elements with equivalent effects are within the scope of the present invention.

In order to protect a speaker in an electronic device so that the speaker is not easily damaged, the present disclosure provides a speaker protection device and a method for calculating excursion of a diaphragm of the speaker. By using a pre-calculated transfer function between a signal and a velocity of the diaphragm of the speaker, the excursion of the diaphragm of the speaker can be accurately estimated to facilitate controlling a signal input to the speaker. As a result, the speaker is not damaged because of the signal. The detailed implementation method is provided as follows.

FIG. 1 depicts a schematic diagram of circuit blocks of a speaker and its protection device according to one embodiment of the present disclosure. As shown in the figure, a speaker protection device 100 includes a detector 110 and a processor 120.

It should be noted that in a speaker 500, its driver (not shown in the figure) can be modularized into a device formed by a series connection of three elements. The above elements are respectively a resistor, an inductor, and a back electromotive force generated when a diaphragm of the speaker 500 is displaced. According to Kirchhoff's circuit law, the relation between the above elements can be transformed into the following formula:

$$v(t) = R_E \cdot i(t) + L_E \frac{di(t)}{dt} + Bl \cdot u(t) \quad \text{Formula 1}$$

In the above formula 1, v(t) stands for voltage, $R_E$ stands for direct-current (DC) resistance, i(t) stands for current, $L_E$ stands for inductance, Bl·u(t) stands for back electromotive force (back emf), Bl stands for force factor, and u(t) is velocity of the diaphragm of the speaker.

A description is provided with reference to FIG. 1. The detector 110 is coupled to the speaker 500, and can be configured to detect a feedback signal of the speaker 500. For example, the detector 110 detects a feedback voltage and a feedback current of the speaker 500. After obtaining the feedback signal of the speaker 500, the processor 120 calculates a DC resistance based on the feedback signal. For example, the DC resistance $R_E$ can be calculated based on a relation between the feedback voltage and the feedback current after obtaining the feedback voltage and the feedback current of the speaker 500.

In one embodiment, the processor 120 can perform low-pass filtering on the feedback signal, for example, perform low-pass filtering on the feedback voltage and the feedback current, so as to filter out high-frequency parts of the feedback voltage and the feedback current. As a result, low-frequency parameters, such as parameters at 17 Hz, are obtained for subsequent calculations. After that, the DC resistance $R_E$ is calculated based on the low-pass filtered feedback voltage and feedback current.

In the application of the present disclosure, the inductance in Formula 1 will be much smaller than the resistance. Hence, the above Formula 1 can be transformed into the following formula:

$$v(t) = R_E \cdot i(t) + Bl \cdot u(t) \quad \text{Formula 2}$$

After rearranging Formula 2, the relation of the velocity of the diaphragm of the speaker u(t) can be obtained as follows:

$$u(t) = \frac{1}{Bl}[v(t) - R_E \cdot i(t)] \quad \text{Formula 3}$$

Moreover, in order to transform Formula 3 into the frequency domain, divide both the left side and the right side by v(s) to obtain a transfer formula from the voltage to the velocity of the diaphragm of the speaker as follows:

$$H_u(s) = \frac{u(s)}{v(s)} = \frac{1}{Bl}\left[\frac{Z(s) - R_E}{Z(s)}\right] \quad \text{Formula 4}$$

In the above Formula 4, z(s)=v(s)/i(s). In addition, if it is assumed that $Z_M(s)=Z(s)-R_E$, then Formula 4 can be transformed into:

$$H_u(s) = \frac{1}{Bl}\left[\frac{Z_M(s)}{Z_M(s) + R_E}\right] \quad \text{Formula 5}$$

Additionally, the relation of impedance $Z_M$ can be obtained:

$$Z_M(s) = \frac{v(s) - R_E i(s)}{i(s)} \quad \text{Formula 6}$$

In one embodiment, the processor 120 can calculate an impedance based on the feedback signal and the DC resistance. A description is provided with reference to the above Formula 6, for example, the processor 120 can calculate an impedance $Z_M$ based on a feedback voltage v(s), a feedback current i(s), and the DC resistance $R_E$.

In another embodiment, the processor 120 can calculate a transfer function between a signal and the velocity of the diaphragm of the speaker based on the DC resistance, the impedance, and a force factor. A description is provided with reference to the above Formula 5, for example, the processor 120 can calculate a transfer function $H_u(s)$ between the signal and the velocity of the diaphragm of the speaker based on the DC resistance $R_E$, the impedance $Z_M$, and the force factor Bl.

Substantially, the excursion of the diaphragm of the speaker can be estimated according to the transfer formula from the voltage to the velocity of the diaphragm of the speaker. The method of estimation is as follows:

$$u_{pre}(s) = H(s) v_{pre}(s) \quad \text{Formula 7}$$

$$u_{pre}(t) = L^{-1}(u_{pre}(s)) \quad \text{Formula 8}$$

$$x_{pre}(t) = \int u_{pre}(t) dt \quad \text{Formula 9}$$

In the above formulae, $v_{pre}(s)$ stands for input voltage, $x_{pre}(t)$ stands for an estimated excursion of the diaphragm of the speaker. It is assumed that the transfer formula $H_u(s)$ does not change within a short time, the input voltage $v_{pre}(s)$ is substituted into Formula 7, and then an inverse Laplace transform is performed through Formula 8. After that, the result is substituted into Formula 9 so that a predicted excursion of the diaphragm of the speaker $x_{pre}(t)$ can be obtained.

In one embodiment, the processor 120 can calculate the excursion of the diaphragm of the speaker based on the input signal and the transfer function. A description is provided with reference to the above Formulae 7 to 9, for example, the processor 120 substitutes the input voltage $v_{pre}(s)$ into Formula 7, and then performs the inverse Laplace transform through Formula 8, and finally substitutes the result into Formula 9 so that the predicted excursion of the diaphragm of the speaker $x_{pre}(t)$ can be obtained.

In another embodiment, the processor 120 can compare the excursion of the diaphragm of the speaker with a preset range of excursion of the diaphragm of the speaker. Once the excursion of the diaphragm of the speaker exceeds the preset range of the excursion of the diaphragm of the speaker, the input signal is adjusted. For example, the excursion of the diaphragm of the speaker has its limit. Once it exceeds a maximum excursion that the diaphragm of the speaker 500 can withstand, the diaphragm of the speaker 500 will be damaged. Therefore, the range of the limit excursion that the diaphragm of the speaker 500 can withstand can be set as the preset range of the excursion of the diaphragm of the speaker in advance. Each time when the input voltage is intended to be provided to the speaker 500, the estimated excursion of the diaphragm of the speaker 500 is calculated in advance through the processor 120 of the present disclosure. If it exceeds the preset range of the excursion of the diaphragm of the speaker, the diaphragm of the speaker 500 is likely damaged. At this time, the above input voltage can be adjusted by using the processor 120 of the present disclosure. In this manner, the diaphragm of the speaker 500 can be protected from being damaged.

In one embodiment, the processor 120 calculates the DC resistance $R_E$ based on the feedback signal in a real-time manner. In another embodiment, the processor 120 of the present disclosure does not calculate the impedance $Z_M$ based on the feedback signal and the DC resistance $R_E$ in the real-time manner. A description is provided with reference to the above Formula 5. For example, when calculating the transfer function $H_u(s)$, two parameters, namely the DC resistance $R_E$ and impedance $Z_M$, are required. For the above impedance $Z_M$, because it is related to the elements in the speaker and the physical characteristics of the elements in the speaker are not easy to change quickly, it can be assumed as a parameter that changes slowly. As a result, the impedance $Z_M$ in Formula 6 does not need to be frequently calculated and updated, so that the computational complexity can be reduced effectively.

In another embodiment, a feasible method for the processor 120 not to calculate the impedance $Z_M$ in the real-time manner is as follows. For example, it refers to updating the impedance of part of frequency bands at regular intervals (such as 1 second) but maintaining the impedance of the remaining frequency bands unchanged, so as to achieve the requirement of reducing the amount of calculation. In addition, the part of the frequency bands refer to the frequency bands corresponding to the large feedback signal. For example, for the input signal that is voice, the range of the frequency band corresponding to the feedback signal greater than a predetermined value (for example, −30 dB) will fall into the range of 0 to 3000 Hz. The predetermined value can thus be set depending on practical needs.

In another embodiment, the processor 120 performs a smoothing process on the excursion of the diaphragm of the speaker so as to generate a smoothed excursion of the diaphragm of the speaker. As a result, the obtained excursion of the diaphragm of the speaker that has been smoothed can be further utilized to protect the speaker 500. For example, the peak measurement, the root mean square (RMS) . . . etc., can be performed. After obtaining the above parameters, the parameters can further be utilized to protect the speaker 500.

Figure 2:
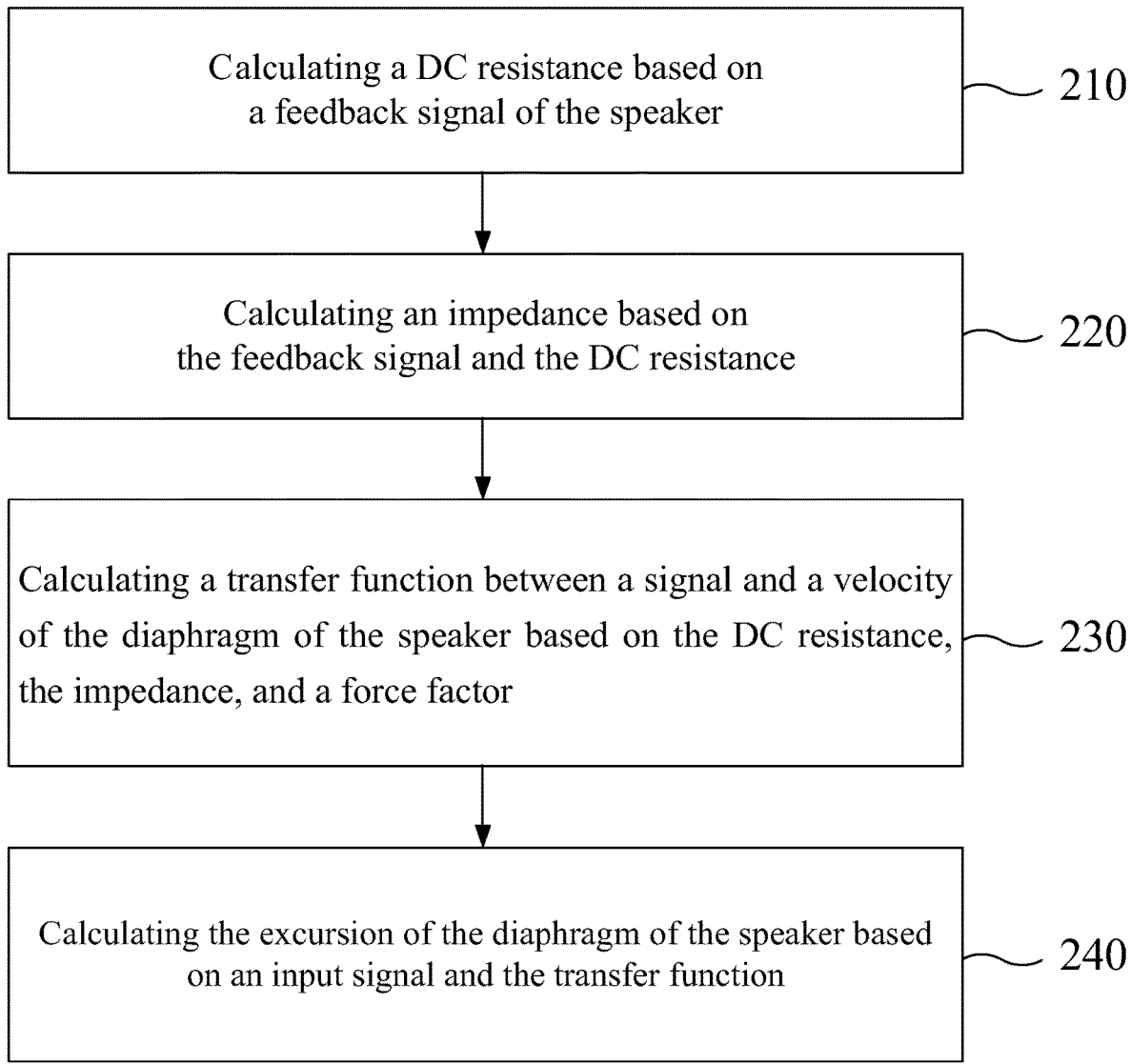
FIG. 2 depicts a flowchart of a method for calculating excursion of a diaphragm of a speaker according to one embodiment of the present disclosure.

FIG. 2 depicts a flowchart of a method for calculating excursion of a diaphragm of a speaker 200 according to one embodiment of the present disclosure. In order to facilitate understanding of the method for calculating the excursion of the diaphragm of the speaker 200, a description is provided with reference to FIG. 1 and FIG. 2. The method for calculating the excursion of the diaphragm of the speaker 200 includes the following steps:

Step 210: calculating a DC resistance based on a feedback signal of the speaker;

Step 220: calculating an impedance based on the feedback signal and the DC resistance;

Step 230: calculating a transfer function between a signal and a velocity of the diaphragm of the speaker based on the DC resistance, the impedance, and a force factor; and Step 240: calculating the excursion of the diaphragm of the speaker based on an input signal and the transfer function.

In step 210, the processor 120 can be used to calculate the DC resistance based on the feedback signal of the speaker. For example, after obtaining a feedback voltage and a feedback current of the speaker 500, the processor 120 can be used to calculate the DC resistance $R_E$ according to a relation between the feedback voltage and the feedback current.

In step 220, the processor 120 can be used to calculate the impedance based on the feedback signal and the DC resistance. A description is provided with reference to the above Formula 6, for example, the processor 120 can be used to calculate the impedance $Z_M$ based on the feedback voltage v(s), the feedback current i(s), and the DC resistance $R_E$.

In step 230, the processor 120 of the present disclosure can be used to calculate the transfer function between the signal and the velocity of the diaphragm of the speaker based on the DC resistance, the impedance, and the force factor. A description is provided with reference to the above Formula 5, for example, the processor 120 can be used to calculate the transfer function $H_u(s)$ between the signal and the velocity of the diaphragm of the speaker based on the DC resistance $R_E$, the impedance $Z_M$, and the force factor Bl.

In step 240, the processor 120 can be used to calculate the excursion of the diaphragm of the speaker based on the input signal and the transfer function $H_u(s)$. A description is provided with reference to the above Formulae 7 to 9, for example, the processor 120 can be used to substitute the input voltage $v_{pre}(s)$ into Formula 7, and then perform the inverse Laplace transform through Formula 8, and finally substitute the result into Formula 9 so that the predicted excursion of the diaphragm of the speaker $x_{pre}(t)$ can be obtained.

In one embodiment, the method for calculating the excursion of the diaphragm of the speaker 200 can further use the processor 120 to compare the excursion of the diaphragm of the speaker with a preset range of excursion of the diaphragm of the speaker. Once the excursion of the diaphragm of the speaker exceeds the preset range of the excursion of the diaphragm of the speaker, the processor 120 is used to adjust the input signal.

In another embodiment, step 210 can further use the processor 120 to calculate the DC resistance $R_E$ based on the feedback signal in a real-time manner. In one embodiment, step 220 can further use the processor 120 not to calculate the impedance $Z_M$ based on the feedback signal and the DC resistance $R_E$ in the real-time manner. A description is provided with reference to the above Formula 5. For example, when calculating the transfer function $H_u(s)$, two parameters, namely the DC resistance $R_E$ and impedance $Z_M$, are required. For the above impedance $Z_M$, it can be assumed as a slowly changing parameter. As a result, the impedance $Z_M$ in Formula 6 does not need to be frequently calculated and updated, so that the computational complexity can be reduced effectively.

In another embodiment, the method for step 220 in which the processor 120 is used not to calculate the impedance $Z_M$ in the real-time manner is as follows. For example, it refers to updating the impedance of part of frequency bands at regular intervals (such as 1 second) but maintaining the impedance of the remaining frequency bands unchanged, so as to achieve the requirement of reducing the amount of calculation. In addition, the part of the frequency bands refer to the frequency bands corresponding to the large feedback signal. For example, for the input signal that is voice, the range of the frequency band corresponding to the feedback signal greater than a predetermined value (for example, −30 dB) will fall into the range of 0 to 3000 Hz. The predetermined value can thus be set depending on practical needs. The method for calculating the excursion of the diaphragm of the speaker 200 may take the form of a computer program product stored on a non-transitory computer-readable storage medium such that the method for calculating the excursion of the diaphragm of the speaker 200 can be implemented after the storage medium is read by the computer.

In one embodiment, the method for calculating the excursion of the diaphragm of the speaker 200 can further use the processor 120 to perform a smoothing process on the excursion of the diaphragm of the speaker so as to generate a smoothed excursion of the diaphragm of the speaker. As a result, the obtained excursion of the diaphragm of the speaker that has been smoothed can be further utilized to protect the speaker 500.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for calculating excursion of a diaphragm of a speaker, comprising:
    calculating a direct-current (DC) resistance based on a feedback signal of the speaker;
    calculating an impedance based on the feedback signal and the DC resistance;
    calculating a transfer function between a signal and a velocity of the diaphragm of the speaker based on the DC resistance, the impedance, and a force factor; and
    calculating the excursion of the diaphragm of the speaker based on an input signal and the transfer function.

2. The method of claim 1, further comprising:
    comparing the excursion of the diaphragm of the speaker with a preset range of excursion of the diaphragm of the speaker; and
    adjusting the input signal when the excursion of the diaphragm of the speaker exceeds the preset range of the excursion of the diaphragm of the speaker.

3. The method of claim 1, further comprising:
    performing low-pass filtering on the feedback signal;
    wherein calculating the DC resistance based on the feedback signal comprises:
    calculating the DC resistance based on the low-pass filtered feedback signal.

4. The method of claim 1, wherein calculating the DC resistance based on the feedback signal comprises:
    calculating the DC resistance based on the feedback signal in a real-time manner.

5. The method of claim 1, wherein calculating the impedance based on the feedback signal and the DC resistance comprises:
    calculating the impedance based on the feedback signal and the DC resistance not in a real-time manner.

6. The method of claim 5, wherein calculating the impedance based on the feedback signal and the DC resistance not in the real-time manner comprises:
    updating the impedance of part of frequency bands based on the feedback signal and the DC resistance at regular intervals.

7. The method of claim 6, wherein the part of the frequency bands comprise a frequency band corresponding to the feedback signal greater than a predetermined value.

8. A speaker protection device, comprising:
    a detector configured to detect a feedback signal of a speaker; and
    a processor configured to:
        calculate a DC resistance based on the feedback signal;
        calculate an impedance based on the feedback signal and the DC resistance;
        calculate a transfer function between a signal and a velocity of a diaphragm of the speaker based on the DC resistance, the impedance, and a force factor; and
        calculate excursion of the diaphragm of the speaker based on an input signal and the transfer function.

9. The speaker protection device of claim 8, wherein the processor is further configured to:
    compare the excursion of the diaphragm of the speaker with a preset range of excursion of the diaphragm of the speaker; and
    adjust the input signal when the excursion of the diaphragm of the speaker exceeds the preset range of the excursion of the diaphragm of the speaker.

10. The speaker protection device of claim 8, wherein the processor is further configured to:
    perform low-pass filtering on the feedback signal; and
    calculate the DC resistance based on the low-pass filtered feedback signal.

11. The speaker protection device of claim 8, wherein the processor is further configured to:
    calculate the DC resistance based on the feedback signal in a real-time manner.

12. The speaker protection device of claim 8, wherein the processor is further configured to:
    calculate the impedance based on the feedback signal and the DC resistance not in a real-time manner.

13. The speaker protection device of claim 12, wherein the processor is further configured to:
    update the impedance of part of frequency bands based on the feedback signal and the DC resistance at regular intervals.

14. The speaker protection device of claim 13, wherein the part of the frequency bands comprise a frequency band corresponding to the feedback signal greater than a predetermined value.

15. A non-transitory computer readable storage medium storing a computer program for performing a method for calculating excursion of a diaphragm of a speaker, wherein the method comprises:
    calculating a DC resistance based on a feedback signal of the speaker;
    calculating an impedance based on the feedback signal and the DC resistance;
    calculating a transfer function between a signal and a velocity of the diaphragm of the speaker based on the DC resistance, the impedance, and a force factor; and
    calculating the excursion of the diaphragm of the speaker based on an input signal and the transfer function.

16. The non-transitory computer readable storage medium of claim 15, wherein the method further comprises:
    comparing the excursion of the diaphragm of the speaker with a preset range of excursion of the diaphragm of the speaker; and
    adjusting the input signal when the excursion of the diaphragm of the speaker exceeds the preset range of the excursion of the diaphragm of the speaker.

17. The non-transitory computer readable storage medium of claim 15, wherein the method further comprises:
    performing low-pass filtering on the feedback signal;
    wherein calculating the DC resistance based on the feedback signal comprises:

calculating the DC resistance based on the low-pass filtered feedback signal.

18. The non-transitory computer readable storage medium of claim 15, wherein calculating the DC resistance based on the feedback signal comprises:
  calculating the DC resistance based on the feedback signal in a real-time manner;
  wherein calculating the impedance based on the feedback signal and the DC resistance comprises:
  calculating the impedance based on the feedback signal and the DC resistance not in the real-time manner.

19. The non-transitory computer readable storage medium of claim 18, wherein calculating the impedance based on the feedback signal and the DC resistance not in the real-time manner comprises:
  updating the impedance of part of frequency bands based on the feedback signal and the DC resistance at regular intervals.

20. The non-transitory computer readable storage medium of claim 19, wherein the part of the frequency bands comprise a frequency band corresponding to the feedback signal greater than a predetermined value.

* * * * *